(12) United States Patent
Sivonen et al.

(10) Patent No.: US 6,963,247 B2
(45) Date of Patent: Nov. 8, 2005

(54) GAIN STABILIZATION TECHNIQUE FOR NARROW BAND INTEGRATED LOW NOISE AMPLIFIERS

(75) Inventors: Pete Sivonen, Espoo (FI); Ari Vilander, Kerava (FI)

(73) Assignee: Nokia Corporation, Espoo (FI)

( * ) Notice: Subject to any disclaimer, the term of this patent is extended or adjusted under 35 U.S.C. 154(b) by 43 days.

(21) Appl. No.: 10/719,589

(22) Filed: Nov. 21, 2003

(65) Prior Publication Data

US 2005/0110575 A1 May 26, 2005

(51) Int. Cl.$^7$ .................................................. H03F 3/04
(52) U.S. Cl. ........................................ 330/302; 330/305
(58) Field of Search ................................. 330/305, 302, 330/310, 311, 286, 306, 307; 333/175

(56) References Cited

U.S. PATENT DOCUMENTS

| | | | |
|---|---|---|---|
| 3,210,681 A | * 10/1965 | Junior | 330/305 |
| 3,482,179 A | * 12/1969 | Lutes, Jr. et al. | 330/305 |
| 3,486,126 A | * 12/1969 | Cadigan et al. | 330/305 |
| 6,259,323 B1 | 7/2001 | Salminen | 330/285 |
| 6,614,303 B2 | 9/2003 | Nentwig | 330/254 |
| 6,646,449 B2 | 11/2003 | Seppinen et al. | 324/624 |
| 2001/0006900 A1 | 7/2001 | Hanninen | 370/278 |
| 2003/0176174 A1 | 9/2003 | Seppinen | 455/226.1 |

* cited by examiner

*Primary Examiner*—Henry Choe
(74) *Attorney, Agent, or Firm*—Harrington & Smith, LLP (57) ABSTRACT

A resonant load circuit is disposed in an integrated circuit, where the resonant load circuit includes an integrated inductance in parallel with an integrated capacitance, and further includes a first integrated resistance $R_s$ in series with one of the inductance and capacitance, preferably in series with the inductance, and a second integrated resistance $R_p$ in parallel with the inductance and capacitance. The first and second integrated resistances have values selected for reducing an amount of resonant load circuit Q over a plurality of instances of the integrated circuit. In a preferred, but non-limiting, embodiment the resonant load circuit forms a load in an RF low noise amplifier, such as a balanced inductively degenerated common source low noise amplifier (LNA).

27 Claims, 8 Drawing Sheets

GAIN STABILIZATION TECHNIQUE FOR NARROW BAND INTEGRATED LOW NOISE AMPLIFIERS

TECHNICAL FIELD

This invention relates generally to radio frequency (RF) amplifiers and, more specifically, relates to an RF amplifier used in an RF receiver, such as a cellular telephone RF receiver where the RF amplifier is implemented in an integrated circuit (IC) form, such as in an RF application specific IC (RF ASIC), preferably as a low noise amplifier (LNA).

BACKGROUND

Figure 1:
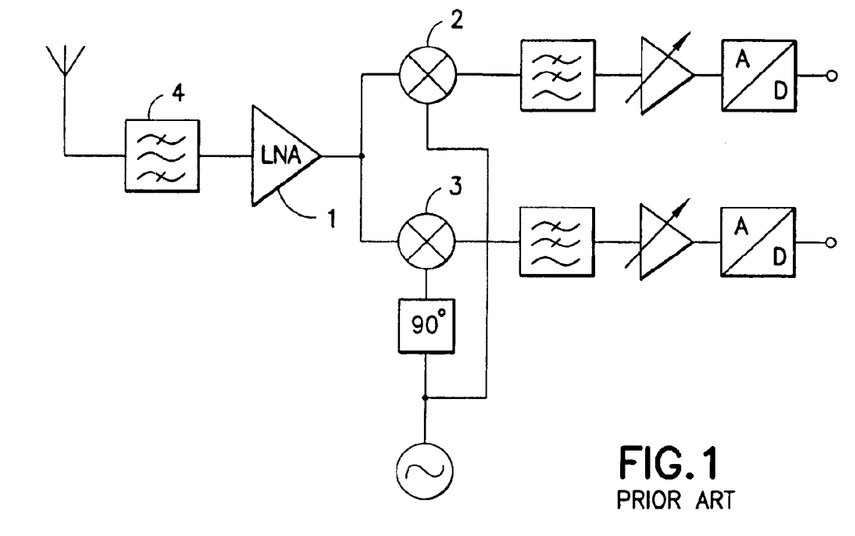
FIG. 1 is a block diagram of a conventional zero-IF or low-IF receiver architecture.

In modern cellular wireless receivers the use of zero-IF or low-IF receiver architectures, such as the one shown in FIG. 1, have become very popular. This is due at least in part to the fact that in these architectures a very high level of integration can be obtained. As a consequence, a low material or component cost can be obtained. Moreover, typically in these receiver topologies, no (off-chip) image filter is required between the LNA 1 and the quadrature mixers 2 and 3, and the LNA 1 can thus drive the mixers 2 and 3 directly on chip. This results also in lower power consumption, because no power is wasted in buffering high-frequency signals off-chip. Moreover, the impedance level between the LNA 1 and the quadrature mixers 2 and 3 can be set and optimized freely, which is a clear advantage when considering the RF front-end performance optimization.

In mass product applications, the radio receiver must meet its dynamic range specifications under nominal conditions and also in the presence of supply voltage, temperature and integrated circuit process variations. Otherwise, the product yield is degraded. The lower and upper ends of the dynamic range are set by the noise and intermodulation characteristics of the radio receiver, respectively. In particular, the noise figure (NF) and input-referred third-order intercept point (IIP3) for the receiver presented in FIG. 1 are given as $$NF = NF_1 + \frac{NF_2 - 1}{G_{a1}} + \frac{NF_3 - 1}{G_{a2}G_{a1}} + \ldots \tag{1}$$

$$\frac{1}{IIP3} \approx \frac{1}{IIP3_1} + \frac{G_{a1}}{IIP3_2} + \frac{G_{a1}G_{a2}}{IIP3_3} + \ldots \tag{2}$$

respectively. Here $NF_1$, $IIP3_1$ and $G_{a1}$ are the NF, IIP3 and the available power gain of the LNA 1, respectively. Correspondingly, $NF_n$, $IIP3_n$ and $G_{an}$ are the NF, IIP, and available power gain of an $n^{th}$ block. The effect of the duplex filter 4 that precedes the LNA 1 is neglected for simplicity.

Equations (1) and (2) reveal the reason why it is important to stabilize the gain of the LNA 1. For example, consider the case in which the gain of an unstabilized LNA 1 is for some reason less than in a nominal condition. Then, according to Eq. (1), the noise contributions of the following stages are suppressed less than in the nominal condition, and the entire receiver may fail to meet its sensitivity requirements. On the other hand, if the gain is too large in some process corner, IIP, given by Eq. (2) is degraded and the receiver may fail to meet its intermodulation specifications. Thus, in order to maximize the yield of the receiver IC, it is very important to stabilize the gain of the LNA 1.

Figure 2:
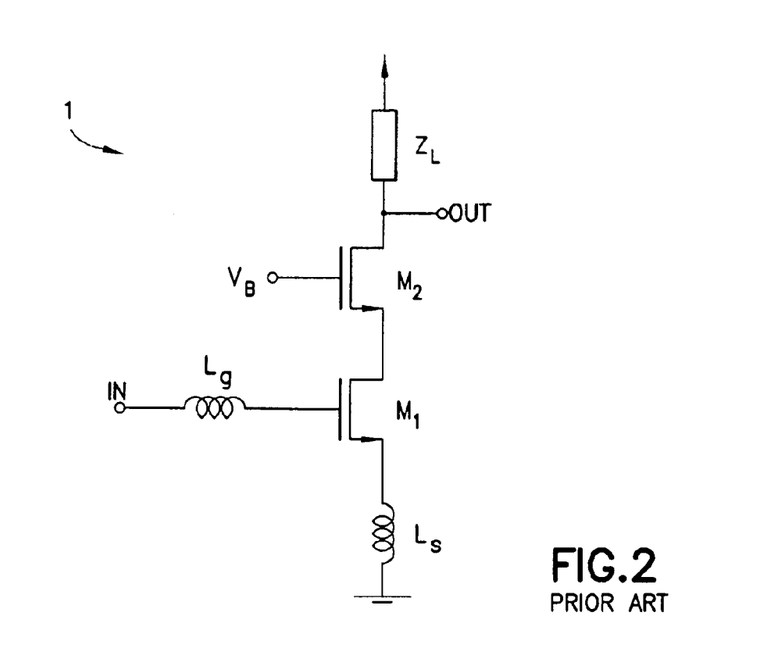
FIG. 2 shows a conventional inductively degenerated common-source LNA.

Many of the reported wireless receivers use an inductively degenerated common-source (emitter) LNA architecture shown in FIG. 2. With this circuit topology, excellent input matching and low NF can be achieved simultaneously. At the resonance frequency $$f_0 = \frac{1}{2\pi\sqrt{(L_g + L_s)C_{gs}}} \tag{3}$$

the input impedance of the LNA 1 is purely real and can be approximated as $$Z_{in} = R_{in} = r_g + \frac{g_m L_s}{C_{gs}}. \tag{4}$$

In order to regulate the input device transconductance $g_m$, and thus the LNA input impedance, the amplifier is biased using a constant-transconductance technique. In the typical case this is sufficient to stabilize the LNA input impedance (see Eq. (4)) adequately against process, supply and temperature variations, since the other terms in Eq. (4) vary less with the process than $g_m$. For example, typically the source inductance $L_s$ is integrated and therefore its performance depends mainly on the device geometry, which is considered to be relatively constant from one die sample to another. In a typical case the inductance of an integrated inductor varies only about ±1% between integrated circuit die samples.

At the operational frequency $f_0$ the transconductance of the input stage is given as $$G_m = \frac{1}{\varpi_0 L_s} \tag{5}$$

and then the LNA voltage gain at $f_0$ is simply given as $$A_v = \frac{|Z_L(\varpi_0)|}{\varpi_0 L_s}, \tag{6}$$

where $|Z_L(\bar{\omega}_0)|$ is the load impedance of the LNA at $f_0$.

It should be noticed that if the input impedance matching conditions (3)-(4) are met, the LNA transconductance, given by Eq. (5), is relatively constant at a given resonance frequency $f_0$, since it depends only on $L_s$. For the same reason, the LNA voltage gain, given by Eq. (6), varies mainly with LNA load impedance at the given frequency $f_0$.

In conclusion, in order to stabilize the voltage gain of the LNA 1 at the operational frequency, the load impedance at the operational frequency should be stabilized against variations. Moreover, it should be noticed that as the LNA load is usually implemented with passive components, it is sufficient to stabilize the variation of only the load impedance against process variations. In general, integrated passive components vary much less with temperature (and supply voltage) than with process. On the other hand, as the LNA 1 is biased with the constant-transconductance technique, the input impedance, and thus the gain of the amplifier, are also stabilized against temperature and supply variations.

Figures 3A, 3B:
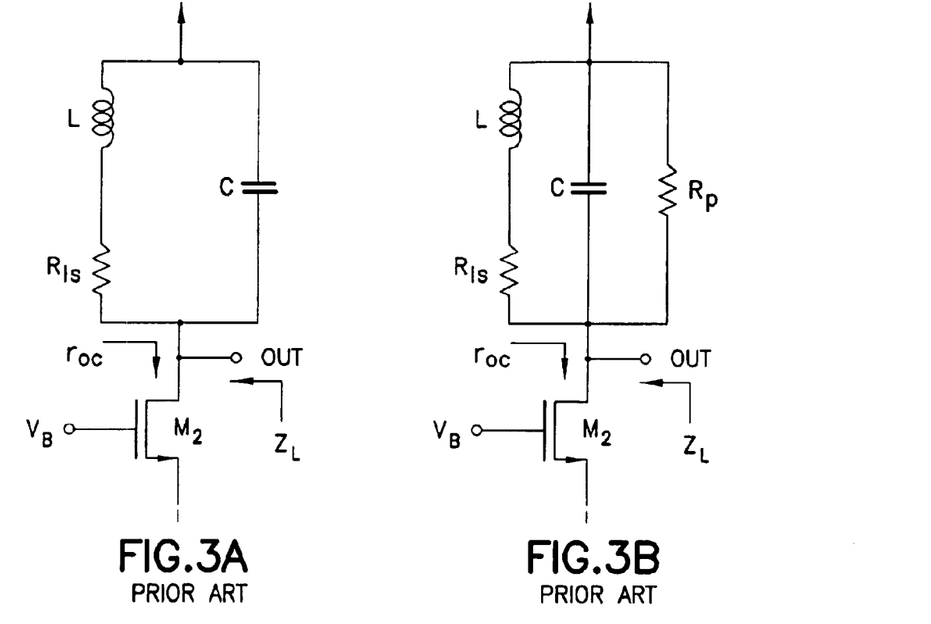
FIGS. 3A and 3B, collectively referred to as FIG. 3, show conventional parallel LC resonator circuits used as a LNA load.

Most of the LNAs known to the inventors use an LC-resonator load to peak the gain of the amplifier at the frequency of interest and to reject the out-of-band interfering signals. A typical parallel LC load used in narrow band tuned amplifiers is shown in FIG. 3a, where the illustrated components form the load $Z_L$ connected to the drain of $M_2$, as shown in FIG. 2. Here C includes also the input capacitances of the following I and Q mixers 3 and 4, and any other parasitic capacitance presented at the output node of the LNA 1.

At the operational frequency $f_0$, L and C are in parallel resonance $$f_0 = \frac{1}{2\pi\sqrt{LC}} \quad (7)$$

and the load impedance of the LNA is purely real $$|Z_L(\varpi_0)| = R_L \approx \frac{(\varpi_0 L)^2}{R_{ls}} \| r_{oc} = (Q\varpi_0 L) \| r_{oc}, \quad (8)$$

where $R_{ls}$ is the series resistance of the load inductor L, $r_{oc}$ is the output impedance of the cascode amplifier and Q is the quality (Q) factor of L. It is reasonable to assume that the Q of the entire resonator is determined by the Q-factor of the integrated inductor L.

As Q-factors of integrated differential inductors used in balanced LNAs are typically larger than 10, the Q of the resonator circuit shown in FIG. 3A is usually too high to be used as such in the LNA. Namely, if the Q of the resonator is high, the bandwidth of the resonator is narrow and the deviation of the integrated capacitor C will spread the load resonance frequency considerably. For the same reason, the magnitude of the LNA load impedance will also vary with C at the resonance frequency. In that the values of the integrated capacitors can deviate as much as ±20% from die sample to die sample, an additional integrated resistance $R_p$ is often placed in parallel (shunt) with the load resonator, as shown in FIG. 3B. The shunt resistor lowers the Q of the LC-circuit and broadens the resonator bandwidth. As a result, the magnitude of the LNA load impedance at the operational frequency varies much less with variations of the parallel capacitance C.

As the shunt resistor $R_p$ lowers the Q of the load resonator, it also lowers the magnitude of the LNA load impedance at the operational frequency:

$$|Z_L(\varpi_0)|=(Q\overline{\omega}_0L)\|r_{oc}\|R_p \approx R_p, \quad (9)$$

where it is assumed that in practice $R_p \ll r_{oc}$ and $R_p \ll (Q \overline{\omega}_0 L)$. Although $R_p$ lowers the magnitude of the LNA load impedance, it is typically still possible to realize LNA voltage gains on the order of 20–25 dB, which represent a gain that is sufficient for many applications of interest.

According to Eq. (9), the LNA load impedance at the resonance frequency is determined mainly with $R_p$. As $R_p$ is realized as an integrated passive resistor, it can be expressed as $R_p = nR_{sh}$ where $R_{sh}$ is the sheet or unit resistance of the resistance material (e.g. polysilicon) and n is the number of the sheet resistances needed to implement the desired resistance value. Moreover, as $R_p$ is directly proportional to $R_{sh}$, the LNA load impedance and also the voltage gain will deviate exactly similarly as $R_{sh}$. For instance, with the typical tolerance of ±20% of integrated polysilicon resistors, the LNA voltage gain variation due to the resistor variation only is almost 20 log 1.2–20 log 0.8=3.5 dB. Therefore, an alternative method for tuning the Q-factor of an LC-parallel resonator needs to be employed in order to stabilize the LNA voltage gain variations. It should be noticed that as the Q-factor of a parallel resonator shown in FIG. 3B can be expressed as $Q = \overline{\omega}_0 CR_p$, the value of Q varies exactly in the same manner as $R_{sh}$.

It can be appreciated that what is required is a technique to stabilize the load impedance and the gain of the LNA 1 at the operational frequency against variations in the values of the integrated capacitors as well as the integrated resistors.

Prior to this invention, this requirement was not adequately met by the prior art.

SUMMARY OF THE PREFERRED EMBODIMENTS

The foregoing and other problems are overcome, and other advantages are realized, in accordance with the presently preferred embodiments of these teachings.

This invention provides a gain stabilization technique for narrow band integrated low-noise amplifiers (LNAs). The circuitry in accordance with this invention regulates the LC-tuned load impedance of the LNA at the operational frequency against variations in the values of passive devices that occur during the typical integrated circuit (IC) process. The impedance stabilization technique is based on the good relative accuracy of integrated resistors in the IC process. Although the absolute variation of the integrated resistors can be as large as ±20%, the relative variation can be made smaller than 1%. By applying the teachings of this invention, the voltage gain variation of the inductively degenerated common-source LNA can be reduced considerably. In addition, by stabilizing the gain of the LNA, an entire radio receiver can more readily meet its required specifications in the presence of IC process variations. As a result, product yield is improved.

In one aspect this invention provides a resonant load circuit disposed in an integrated circuit, where the resonant load circuit includes an integrated inductance in parallel with an integrated capacitance, and further includes a first integrated resistance $R_s$ in series with one of the inductance and capacitance, preferably in series with the inductance, and a second integrated resistance $R_p$ in parallel with the inductance and capacitance. The first and second integrated resistances have values selected for reducing an amount of resonant load circuit Q over a plurality of instances of the integrated circuit. In a preferred, but non-limiting embodiment the resonant load circuit forms a load in an RF low noise amplifier, such as a balanced inductively degenerated common source low noise amplifier (LNA).

In another aspect this invention provides a method to define a resonant load circuit that is disposed in an integrated circuit. The resonant load circuit includes an integrated inductance in parallel with an integrated capacitance. The method includes defining a first integrated resistance $R_s$ in series with one of the inductance and capacitance; and defining a second integrated resistance $R_p$ in parallel with said inductance and capacitance. The first and second integrated resistances are defined to have values selected for reducing an amount of resonant load circuit Q over a plurality of instances of the integrated circuit.

Embodiments of this invention disposed in an RF transceiver, such as one found in a mobile station, such as a cellular telephone, are also disclosed.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figures 4A, 4B:
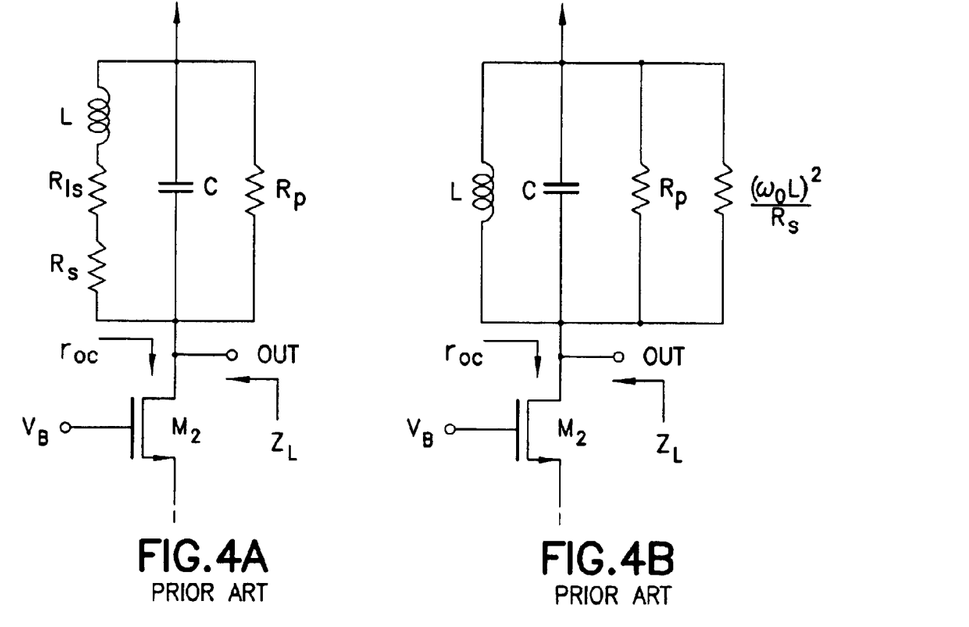
FIGS. 4A and 4B, collectively referred to as FIG. 4, illustrate an improved and compensated LNA load LC-resonator circuit in accordance with an aspect of this invention.

FIG. 4A illustrates a first embodiment of a technique for reducing the variations of the LC-resonator Q-factor with respect to the variations of $R_{sh}$. In this circuit, two resistors $R_s$ and $R_p$, realized with the same resistance material, are used to reduce Q of the resonator. As seen, resistor $R_s$ is placed in series with inductor L while resistor $R_p$ is placed in parallel with the entire resonator. Moreover, $R_s$ and $R_p$ can be expressed as $R_s = n_s R_{sh}$ and $R_p = n_p R_{sh}$, respectively. Practical and non-limiting design values are $R_{sh} = 100\Omega$, $R_s = 14\Omega$ and $R_p = 200\Omega$. Moreover, it should be noticed that since the resistors $R_s$ and $R_p$ are realized with the same material, and since these resistors are preferably placed close to each other on the IC, their process gradient is very similar. Thus, if the value of $R_{sh}$ is, for example, less than that under nominal condition, the values of $R_s$ and $R_p$ will both decrease.

In order to explain the operation of the circuit, consider the case where the value of $R_{sh}$ is for some reason larger than the in nominal case. Now, due to the increased $R_{sh}$, the Q of the inductor L is decreased because the value of its series resistance $R_s$ is increased. For the same reason, the Q of the entire resonator is decreased. However, as the value of parallel resistor $R_p$ is increased, the Q of the entire resonator is increased. Thus, the reduction of the Q-factor of the inductor L is compensated for, and the Q of the total resonator is left relatively unchanged. To show this analytically, the L-$R_s$ series impedance is first transformed to the corresponding parallel impedance at the resonance frequency. The resulting circuit for analyzing the load impedance $Z_L$ is shown in FIG. 4b. It is assumed for simplicity that $R_{ls} \ll R_s$. This assumption can be validated with practical design values. At the resonance frequency (see Eq. (7)), impedance $Z_L$ is given as $$|Z_L(\varpi_0)| = R_L \approx \frac{(\varpi_0 L)^2}{R_s} \| R_p = \frac{n_p R_{sh}(\varpi_0 L)^2}{n_p n_s R_{sh}^2 + (\varpi_0 L)^2}. \tag{10}$$

In addition $$\frac{\partial Z_L}{\partial R_{sh}} = \frac{n_p(\varpi_0 L)^2 ((\varpi_0 L)^2 - n_p n_s R_{sh}^2)}{((\varpi_0 L)^2 + n_p n_s R_{sh}^2)^2}. \tag{11}$$

From Eq. (11) it is seen that the derivative of $Z_L$ with respect to $R_{sh}$ is zero, if $$R_{sh}^2 = \frac{(\varpi_0 L)^2}{n_p n_s}. \tag{12}$$

Therefore, the values for $n_s$ and $n_p$ are selected so that they obey the following equation:

$$n_p n_s = \frac{(\varpi_0 L)^2}{R_{sh0}^2}, \tag{13}$$

where $R_{sh0}$ is the nominal value of the sheet or unit resistance (i.e. of polysilicon). By selecting $n_s$ and $n_p$ in this manner, a given deviation (i.e., ±20%) of $R_{sh}$ has a least effect on the value of the LNA load impedance at the resonance frequency. This is because $R_{sh}$ varies now in the region where the derivative of $Z_L$ with respect to $R_{sh}$ is zero. It is a well-known fact that the derivative of given function f(x) with respect to variable x describes how rapidly f(x) varies with x. Therefore, the variation of f(x) is at a minimum in the region where its derivative is zero.

Figure 5:
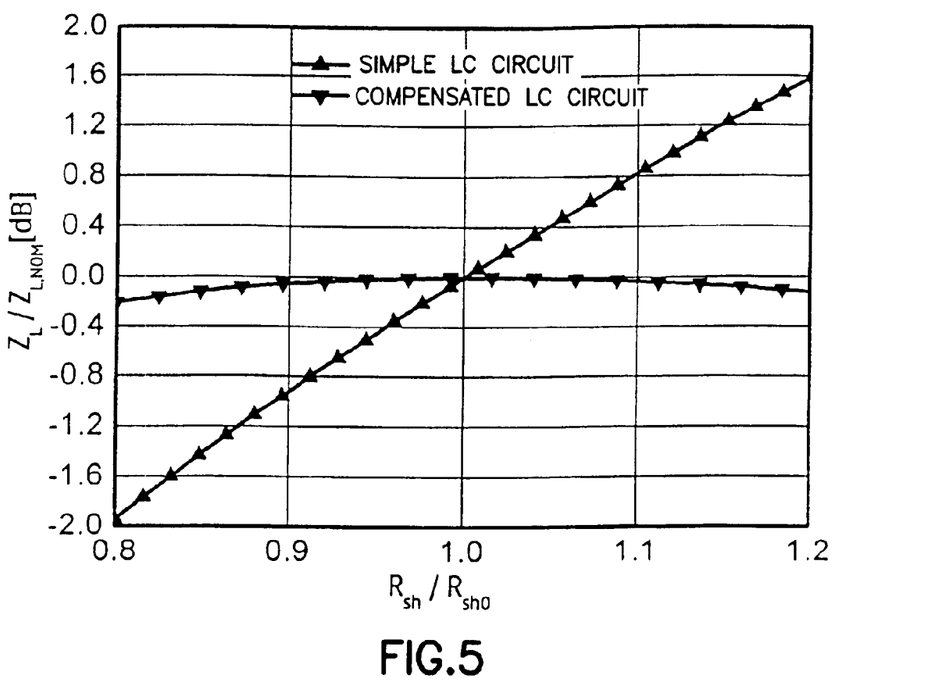
FIG. 5 is a graph that shows the effect of sheet resistance $R_{sh}$ deviation on a simple parallel resonator load and on a compensated resonator load.

The effect of the deviation of $R_{sh}$ to the simple (FIG. 3b) and compensated (FIG. 4) resonator load circuits is illustrated graphically in FIG. 5. Here the relative variations (in decibels) of the magnitudes of the LNA load impedances are plotted as a function of the variation of $R_{sh}$ at the resonance frequency. It is assumed that the deviation of $R_{sh}$ is ±20%. In the case of the simple LC resonator load shown in FIG. 3b, the component values used are, for an exemplary frequency $f_0=2$ GHz, L=3.4 nH, C=1.9 pF, and $R_p=110\Omega$. In the case of improved LC load shown in FIG. 4, the components values are, again for the exemplary frequency of $f_0=2$ GHz, L=3.4 nH, C=1.9 pF, $R_{sh0}=100\Omega$, $n_s=0.1$ and $n_{np}=2$. These values obey Eq. (13). It is seen that in the case of the simple resonator load, the $R_{sh}$ deviation of ±20% leads to the 3.5 dB variation in the LNA load impedance and gain. However, in the case of compensated resonator, the corresponding variation is only 0.2 dB. Therefore, the compensated resonator structure shown in FIG. 4 greatly stabilizes the load impedance and voltage gain of the LNA 1.

Figure 6:
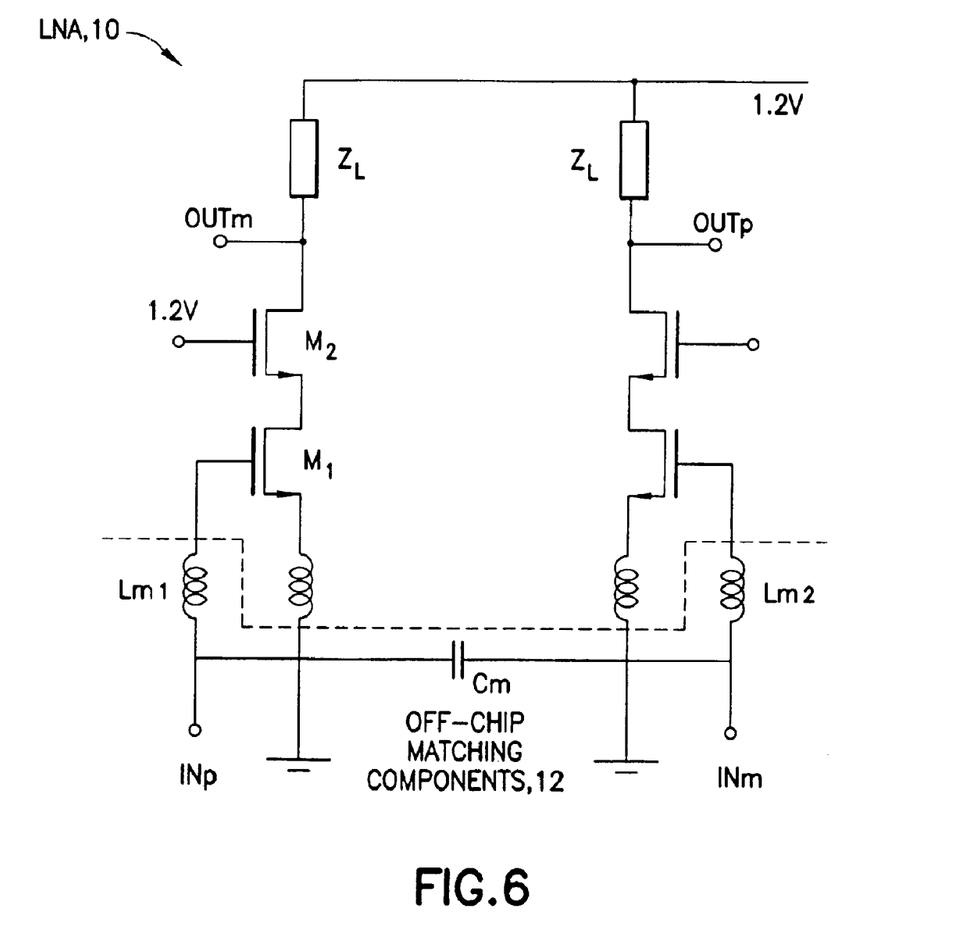
FIG. 6 illustrates a balanced inductively degenerated common-source LNA.

A presently preferred, and non-limiting, design procedure for the narrow band LNA 1 LC load impedance is now demonstrated. Both the design of the simple and compensated resonator circuits is presented, and the gain variations in the both cases are simulated. The LNA itself is based on an inductively degenerated common-source LNA 10, as shown in FIG. 6. The amplifier operates at 2 GHz, and is assumed to be implemented in 0.13 um CMOS technology. Of course, neither of these parameters are limitations on the practice and use of this invention. In this exemplary technology, the value deviations of the integrated metal-oxide-metal (MOM) capacitors and polysilicon (poly) resistors are about ±20% and ±12.5%, respectively. In order to reject interference from the substrate or supply, the LNA 10 is realized as a balanced circuit, and is assumed to drive the I and Q mixers directly on-chip.

Typically, the input stage of the LNA 10 shown in FIG. 6 is designed for low noise and acceptable linearity. Moreover, the amplifier should present a regulated input impedance (usually 50Ω single-ended) to the filter driving the LNA 10. Usually, these specifications largely determine the properties of the input stage of the LNA 10 and, therefore, the amplifier input stage transconductance given by Eq. (5). Thus, the voltage gain of the LNA 10 at the operational frequency is set to a desired value (such as 15–25 dB) by designing the load impedance accordingly. In this non-limiting example it is assumed that the LNA 10 should provide about 21 dB voltage gain at 2 GHz.

The off-chip matching components 12 shown in FIG. 6 function as input impedance matching components. In that the Q factor of these input impedance matching components directly affects the noise figure of the LNA 10, these matching (m) components ($C_m$, $L_{m1}$, $L_{m2}$) are preferably placed off-chip (e.g., external to the RF ASIC), as external passive components generally experience less losses than on-chip integrated components. However, the input impedance matching of the LNA 10 can be accomplished in various ways, and it is within the scope of this invention to also integrated $C_m$, $L_{m1}$, $L_{m2}$ on-chip.

Figure 7:
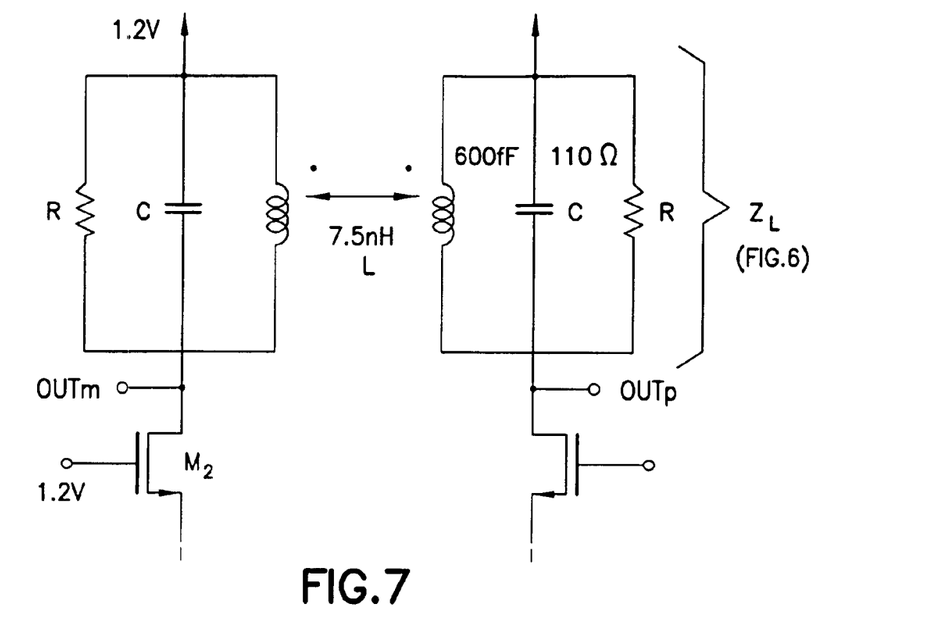
FIG. 7 shows a simple parallel LC load.

The design of the simple LC load resonator presented in FIG. 3 is relatively straightforward, since there are only three parameters C, L and $R_p$ that need to be determined. First, L and C must resonate at 2 GHz. Here, the differential inductor L of 7.5 nH having a Q of 11 at 2 GHz is used, as shown in FIG. 7. This requires a parallel MOM capacitance C of 600 fF with parasitics to peak the gain of the amplifier at 2 GHz. Parallel 110Ω resistors R set the gain of the LNA 10 to 21 dB.

Figure 8:
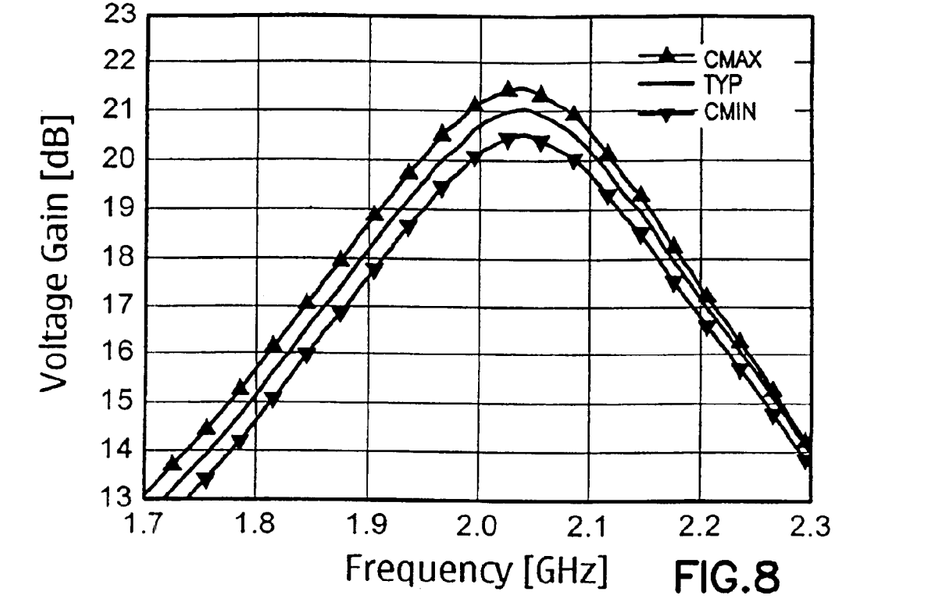
FIG. 8 shows LNA voltage gain deviation due to MOM capacitor deviation of ±20% (for the resonator shown in FIG. 7).

The effect of the parallel MOM capacitance deviation on the simulated LNA voltage gain is presented in FIG. 8. The gain is plotted with typical, minimum and maximum capacitor parameters. It can be seen that since the Q of the load resonator is low, the ±20% variation of the MOM capacitors results in only a 1 dB voltage gain variation. Moreover, the nominal peak gain of the amplifier is about 21 dB at 2 GHz.

Figure 9:
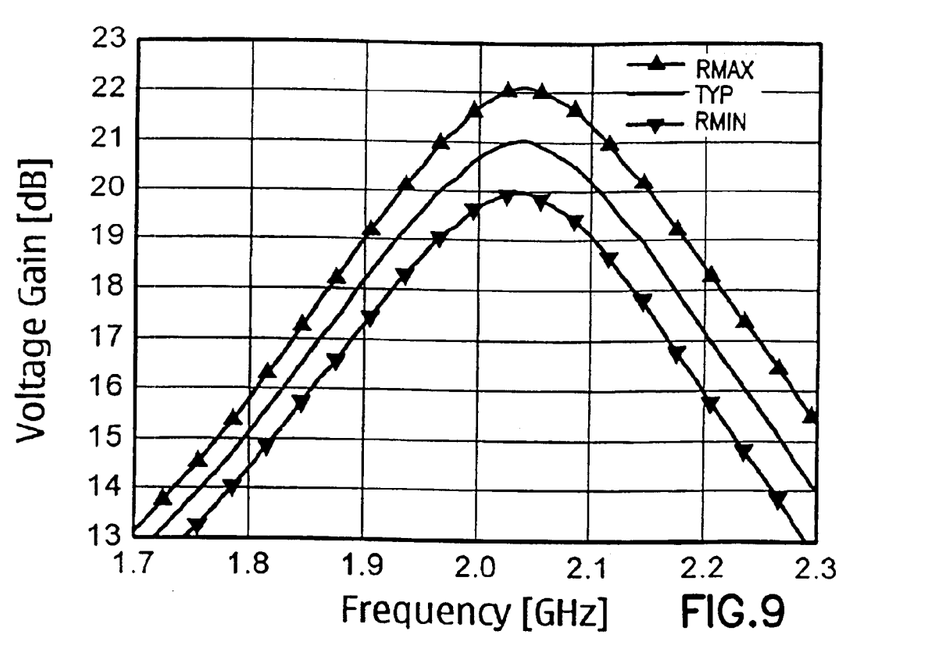
FIG. 9 shows LNA voltage gain deviation due to poly sheet resistance deviation of ±12.5% (for the resonator shown in FIG. 7).

The effect of the parallel poly resistor deviation on the simulated LNA voltage gain is presented in FIG. 9. The gain is plotted with typical, minimum and maximum resistor parameters. It is seen that the poly sheet resistance deviation of ±12.5% results in greater than a 2dB variation in the LNA load impedance and gain. This ensures that the gain in the case of simple LC resonator load shown in FIG. 7 deviates almost completely in the same way as the polysilicon sheet resistance deviates. For instance, in the case of the ±12.5% deviation, it can be immediately approximated that the gain should deviate 20 log 1.125–20 log 0.875=2.2 dB, which is approximately equal to the result predicted by simulations (2.1 dB). Correspondingly, the gain of the LNA 10 spreads more than 2 dB if the poly resistor deviates more than ±12.5%.

The design of the compensated LC load resonator presented in FIG. 4 requires few more steps than the design of simple resonator, since there are now five parameters C, L and $R_{sh}$, $n_s$ and $n_p$ that need to be determined. First, L and C must resonate at 2 GHz. Moreover, to provide for proper operation of the gain compensation technique the inductor Q must be sufficiently high to ensure that its series resistance is considerably smaller than $R_s$. Since the Q of the integrated inductor at certain frequencies typically increases with an increase in the inductance of the inductor, it is important to use a sufficiently large inductance for L. In the illustrated example the differential inductor of 7.5 nH having a Q of 11 at 2 GHz is used as was shown in FIG. 8. This requires the parallel MOM capacitance of 600 fF with parasitics to peak the gain of the amplifier at 2 GHz.

The resistors $R_s$ and $R_p$, or the parameters $n_s$ and $n_p$, are selected so that they realize the required parallel LNA load impedance $R_L$ (see Eq. 10), and therefore the desired voltage gain, and such that they obey Eq. (13). The values of parameters $n_p$ and $n_s$ can be obtained by solving Equations (10) and (13):

$$n_p = \frac{2R_L}{R_{sh0}} \tag{14}$$

$$n_s = \frac{(\varpi_0 L)^2}{2R_L R_{sh0}}. \tag{15}$$

From the design of the simple LC load (see FIG. 7) it is known that in order to set the gain of the LNA 10 to 21 dB, parallel resistors of 110Ω are needed. Moreover, one can select the unit resistor $R_{sh0}$ as 100Ω. Then $$n_p = \frac{2 \cdot 110 \ \Omega}{100 \ \Omega} \approx 2.2$$

and $$n_s = \frac{(2\pi \cdot 2 \ \text{GHz} \cdot 3.75 \ \text{nH})^2}{2 \cdot 110 \ \Omega \cdot 100 \ \Omega} \approx 0.1.$$

Figure 10:
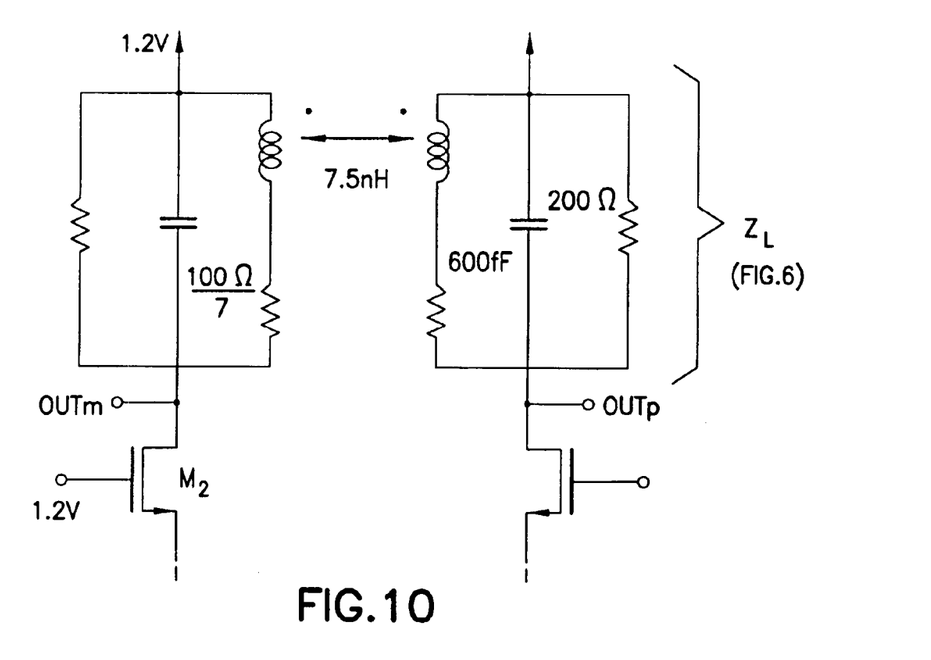
FIG. 10 illustrates a compensated parallel LC load.

The values for the resistors $R_s$ and $R_p$ are given as $R_s$=2.2·100Ω≈2,1000Ω and $R_s$=100Ω/10. It should be noted that $R_s$ and $R_p$ are implemented with multiple units of resistors $R_{sh}$=100Ω in order to minimize their relative deviation. The calculated values for $R_s$ and $R_p$ may be used for the initial design of the LC resonator. Further simulations indicate that the value of 200Ω is optimal for $R_s$, but 100Ω/7 is more preferred for $R_s$ than 100Ω/10. The final component values for the resonator are summarized in FIG. 10.

Figure 11:
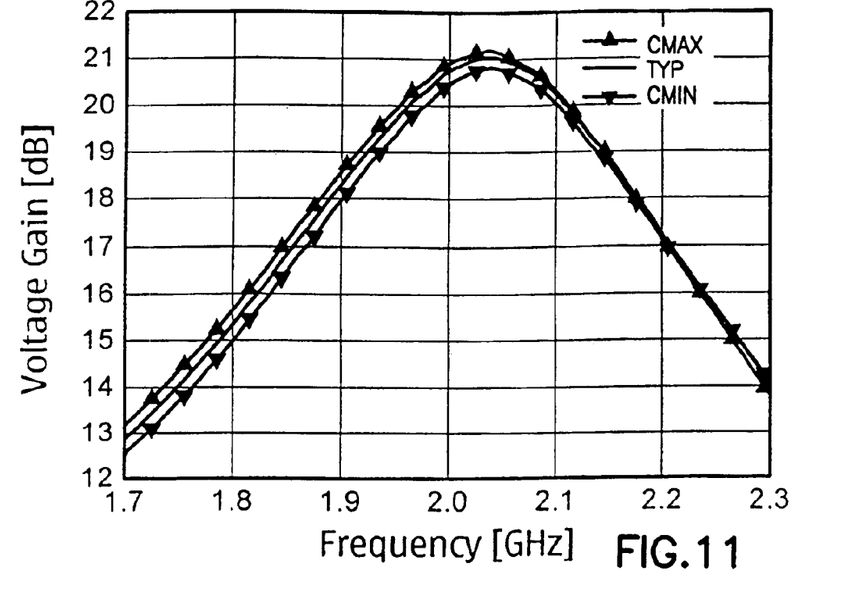
FIG. 11 is a graph that shows LNA voltage gain deviation due to MOM capacitor deviation of ±20% (for the resonator shown in FIG. 10).

The effect of the parallel MOM capacitance deviation on the simulated LNA voltage gain, in the case of compensated LC load, is presented in FIG. 11. The gain is plotted with typical, minimum and maximum capacitor parameters. It can be seen that since the Q of the load resonator is low, the ±20% variation of the capacitors results in only a 0.4 dB voltage gain variation. Moreover, the nominal peak gain of the amplifier is about 21 dB at 2 GHz.

Figure 12:
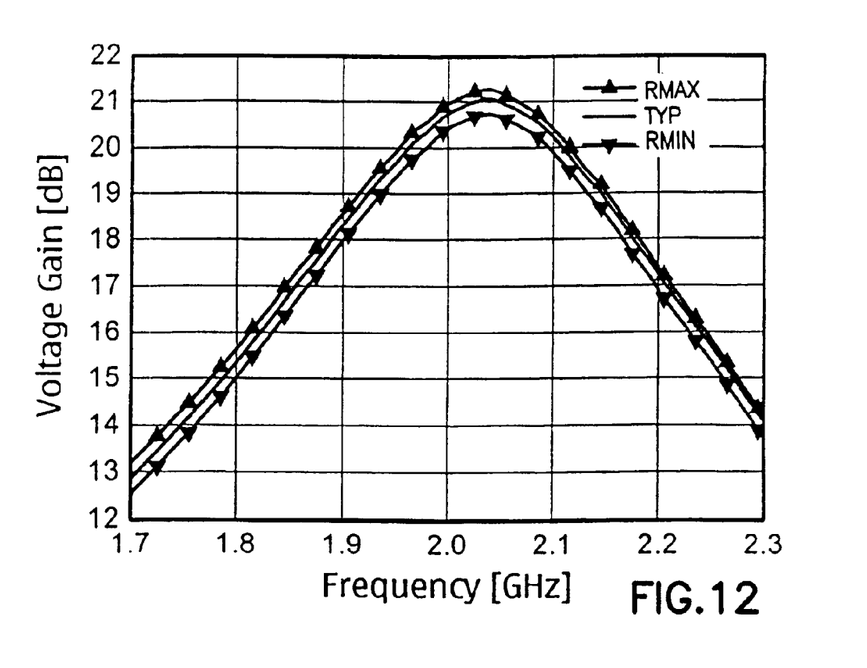
FIG. 12 is a graph showing LNA voltage gain deviation due to poly sheet resistance deviation of ±12.5% (for the resonator shown in FIG. 10).

The effect of the parallel poly resistor deviation on the simulated LNA voltage gain, in the case of the compensated LC load, is presented in FIG. 12. The gain is plotted with typical, minimum and maximum resistor parameters. It can be seen that the poly sheet resistance deviation of ±12.5% results in only a 0.5 dB variation in the gain, as compared to the 2.1 dB in the case of simple LC load. The difference is larger if the sheet resistance of the resistor material deviates by more than ±12.5%.

Presently preferred embodiments of a gain stabilization technique for the narrow band integrated LNA 10 has been presented. The impedance stabilization technique in accordance with this invention regulates the LC-tuned load impedance of the amplifier at the operational frequency against IC process related variations in the values of passive devices. The impedance stabilization technique is based on the assumed good relative accuracy of integrated resistors in the IC process. By applying the method in accordance with this invention, the voltage gain variation of the inductively degenerated common-source LNA 10 can be reduced several decibels, depending on the deviation of the sheet resistance of the resistor material. By stabilizing the gain of the LNA 10, the entire radio receiver can more readily meet its required specifications in the presence of IC process variations. As a result, product yield is improved.

It can be noted that one might attempt to assemble similar circuitry using discrete components, however it would be necessary measure resistors and to select resistor pairs having the same tolerance that varies in the same direction. As can be appreciated, this is impractical in a mass-production environment. Thus, in the presently preferred embodiments of this invention the components, including the inductance(s), are integrated components, not discrete components. That is, in the presently preferred embodiments all resonant circuit components, including L, are integrated on same IC.

Figure 13:
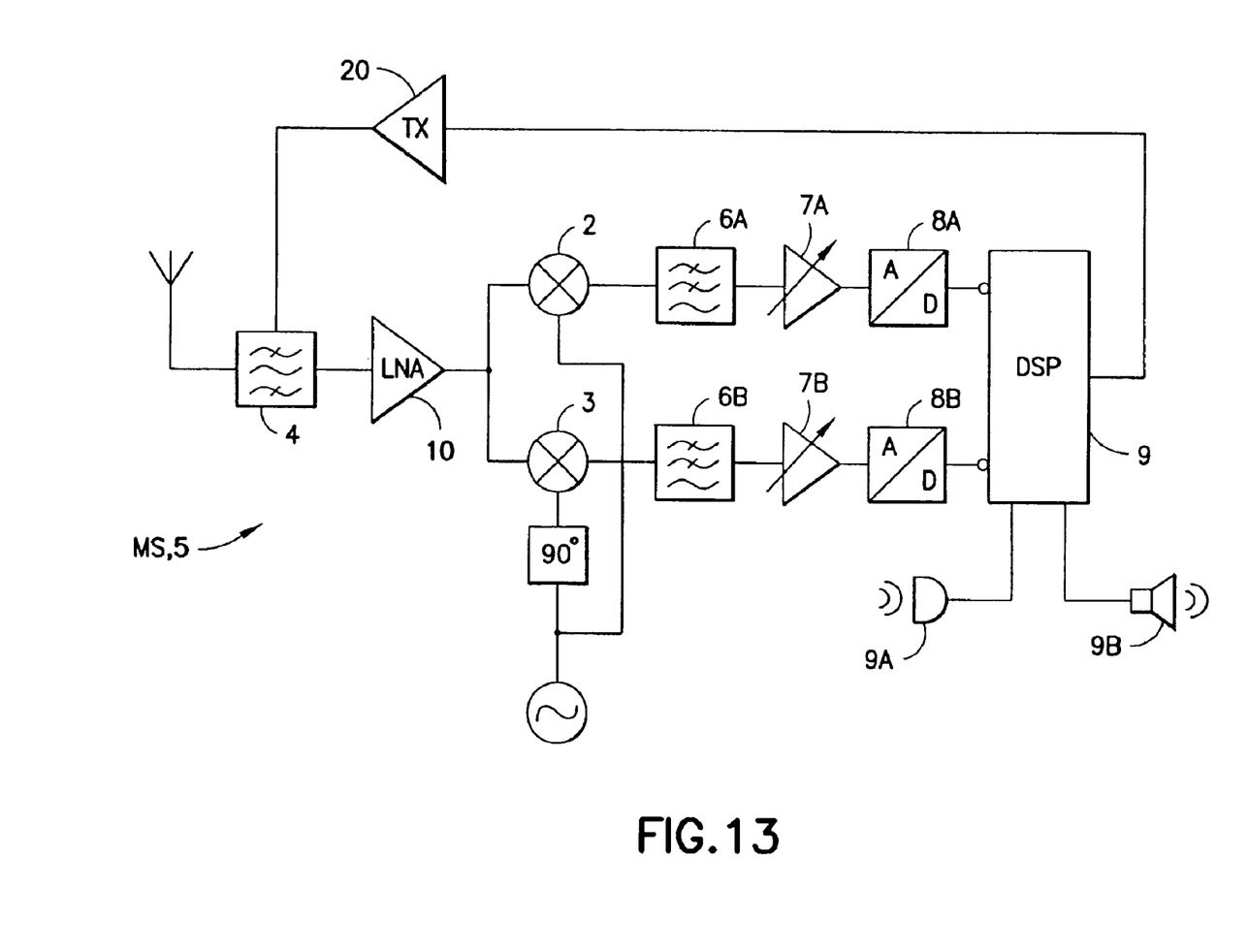
FIG. 13 is a simplified block diagram of a mobile station having an RF transceiver that includes at least one integrated circuit having a resonant circuit in accordance with this invention.

FIG. 13 is a simplified block diagram of a non-limiting embodiment of a mobile station (MS) 5 having an RF transceiver that includes at least one integrated circuit having an integrated resonant circuit in accordance with this invention. The MS 5 can be a cellular telephone having voice and/or data, such as packet data, capabilities. In the illustrated embodiment the RF transceiver includes the improved LNA 10 coupled to the duplexer 4 and the I and Q mixers 2 and 3. The outputs of the mixers 2 and 3 are coupled through filters 6A, 6B to variable gain amplifiers 7A, 7B, and thence to analog to digital converters 8A, 8B. A signal processor, such as a digital signal processor (DSP) 9 processes the digitized received signal. In a voice-capable MS 5 there will also be an input voice transducer 9A and an output voice transducer 9B. Being an RF transceiver, there is also a transmitter chain, shown simplified as the transmitter (TX) block 20. The TX block 20 will typically also be at least partially integrated into at least one RF IC, and can also include at least one integrated RF circuit having an improved integrated resonant circuit in accordance with this invention.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalent circuits may be attempted by those skilled in the art. However, it is hereby noted that in general this invention applies to all integrated LC resonant circuits where a substantially constant value of Q is desired over a range of possible process variations. Thus, while the foregoing description has been made in the context of the LNA 10, which is a presently preferred best mode, this invention can also be employed to advantage in the design and construction of, as non-limiting and non-exhaustive examples, IF amplifiers, oscillator resonant circuits and frequency filters. As was noted above with respect to FIG. 13, this invention is not restricted for use with integrated receiver circuits, but can be used as well with, for example, integrated transmitter circuits.

The use of this invention is also not limited to only the zero-IF or substantially zero-IF types of direct conversion receiver architectures, such as the one depicted in FIG. 1. For example, superheterodyne and other types of RF receiver architectures may benefit from the use of the Q stabilization method and apparatus in accordance with this invention.

Further, it should be noted that $R_s$ could be placed in series with C. In this case, because there is no DC current flowing through $R_s$ there would not be a DC voltage drop. However, due to the fact that C has a parasitic capacitance, the Q stabilization is preferred in the L branch. However, in some embodiments it may be desired to place the series Q stabilizing resistance Rs in series with the capacitance instead of the inductance.

Thus, all such and similar modifications of the teachings of this invention will still fall within the scope of this invention.

What is claimed is:

1. A resonant load circuit disposed in an integrated circuit, said resonant load circuit comprising an integrated inductance in parallel with an integrated capacitance, further comprising a first integrated resistance $R_s$ in series with one of said inductance and capacitance, and a second integrated resistance $R_p$ in parallel with said inductance and capacitance, said first and second integrated resistances having values selected for reducing an amount of resonant load circuit Q over a plurality of instances of the integrated circuit.

2. A resonant load circuit as in claim 1, where said first integrated resistance is connected in series with said inductance.

3. A resonant load circuit as in claim 1, where said resonant load circuit forms a load in an RF low noise amplifier.

4. A resonant load circuit as in claim 1, where said resonant circuit forms a load in an RF low noise amplifier of a direct conversion receiver.

5. A resonant load circuit as in claim 1, where values for a number of units of sheet resistance for defining $R_s$ and $R_p$, $n_s$ and $n_p$, respectively, are selected to obey:

$$n_p n_s = \frac{(\varpi_0 L)^2}{R_{sh0}^2},$$

where $R_{sh0}$ is a nominal value of the sheet or unit resistance of the integrated circuit,
and where:

$$n_p = \frac{2R_L}{R_{sh0}}, \text{ and}$$

$$n_s = \frac{(\varpi_0 L)^2}{2R_L R_{sh0}},$$

where $R_L$ is a desired value of load impedance.

6. A resonant load circuit as in claim 5, where said first resistance is connected in series with said inductance, where said resonant load circuit forms a load in a balanced inductively degenerated common source low noise amplifier (LNA), and where $R_L$ is a desired value of a parallel LNA load impedance.

7. A resonant load circuit as in claim 5, where $R_s$ and $R_p$ are implemented with multiple units of resistors $R_{sh}$=100Ω in order to minimize relative deviation between $R_s$ and $R_p$.

8. A method to define a resonant load circuit that is disposed in an integrated circuit, said resonant load circuit comprising an integrated inductance in parallel with an integrated capacitance, comprising:

defining a first integrated resistance $R_s$ in series with one of said inductance and capacitance; and defining a second integrated resistance $R_p$ in parallel with said inductance and capacitance, where said first and second integrated resistances are defined to have values selected for reducing an amount of resonant load circuit Q over a plurality of instances of the integrated circuit.

9. A method as in claim 8, where values for a number of units of sheet resistance for defining $R_s$ and $R_p$, $n_s$ and $n_p$, respectively, are selected to obey:

$$n_p n_s = \frac{(\varpi_0 L)^2}{R_{sh0}^2},$$

where $R_{sh0}$ is a nominal value of the sheet or unit resistance of the integrated circuit, and where:

$$n_p = \frac{2R_L}{R_{sh0}}, \text{ and}$$

$$n_s = \frac{(\varpi_0 L)^2}{2R_L R_{sh0}},$$

where $R_L$ is a desired value of load impedance.

10. A method as in claim 9, where said first resistance is connected in series with said inductance, where said resonant load circuit forms a load in a balanced inductively degenerated common source low noise amplifier (LNA), and where $R_L$ is a desired value of a parallel LNA load impedance.

11. A method as in claim 9, where $R_s$ and $R_p$ are implemented with multiple units of resistors $R_{sh}=100\Omega$ in order to minimize relative deviation between $R_s$ and $R_p$.

12. A method as in claim 8, where said first integrated resistance is connected in series with said inductance.

13. A method as in claim 8, where said resonant load circuit forms a load in an RF low noise amplifier.

14. A method as in claim 8, where said resonant circuit forms a load in an RF low noise amplifier of a direct conversion receiver.

15. A balanced inductively degenerated common source low noise amplifier (LNA) disposed in an integrated circuit, said LNA comprising a load impedance comprised of an integrated inductance in parallel with an integrated capacitance, further comprising a first integrated resistance $R_s$ in series with said inductance and a second integrated resistance $R_p$ in parallel with said inductance and capacitance, said first and second integrated resistances having values selected for reducing an amount of resonant load circuit Q over a plurality of instances of the integrated circuit.

16. A LNA as in claim 15, where said LNA forms a part of a direct conversion receiver.

17. A LNA as in claim 15, where said LNA forms a part of a RF communications device.

18. A LNA as in claim 15, where values for a number of units of sheet resistance for defining $R_s$ and $R_p$, $n_s$ and $n_p$, respectively, are selected to obey:

$$n_p n_s = \frac{(\varpi_0 L)^2}{R_{sh0}^2},$$

where $R_{sh0}$ is a nominal value of the sheet or unit resistance of the integrated circuit, and where:

$$n_p = \frac{2R_L}{R_{sh0}}, \text{ and}$$

$$n_s = \frac{(\varpi_0 L)^2}{2R_L R_{sh0}},$$

where $R_L$ is a desired value of a parallel LNA load impedance.

19. A LNA as in claim 18, where $R_s$ and $R_p$ are implemented with multiple units of resistors $R_{sh}=100\Omega$ in order to minimize relative deviation between $R_s$ and $R_p$.

20. An RF transceiver comprising at least one resonant load circuit disposed in at least one integrated circuit, said resonant load circuit comprising an integrated inductance in parallel with an integrated capacitance, further comprising a first integrated resistance $R_s$ in series with one of said inductance and capacitance, and a second integrated resistance $R_p$ in parallel with said inductance and capacitance, said first and second integrated resistances having values selected for reducing an amount of resonant load circuit Q over a plurality of instances of the integrated circuit.

21. An RF transceiver as in claim 20, where said first integrated resistance is connected in series with said inductance.

22. An RF transceiver as in claim 20, where said at least one resonant load circuit forms a load in an RF low noise amplifier.

23. An RF transceiver as in claim 20, where said at least one resonant circuit forms a load in an RF low noise amplifier of a direct conversion receiver.

24. An RF transceiver as in claim 20, where values for a number of units of sheet resistance for defining $R_s$ and $R_p$, $n_s$ and $n_p$, respectively, are selected to obey:

$$n_p n_s = \frac{(\varpi_0 L)^2}{R_{sh0}^2},$$

where $R_{sh0}$ is a nominal value of the sheet or unit resistance of the integrated circuit, and where:

$$n_p = \frac{2R_L}{R_{sh0}}, \text{ and}$$

$$n_s = \frac{(\varpi_0 L)^2}{2R_L R_{sh0}},$$

where $R_L$ is a desired value of load impedance.

25. An RF transceiver as in claim 24, where said first resistance is connected in series with said inductance, where said at least one resonant load circuit forms a load in a balanced inductively degenerated common source low noise amplifier (LNA), and where $R_L$ is a desired value of a parallel LNA load impedance.

26. An RF transceiver as in claim 24, where $R_s$ and $R_p$ are implemented with multiple units of resistors $R_{sh}=100\Omega$ in order to minimize relative deviation between $R_s$ and $R_p$.

27. A mobile station having an RF transceiver and comprising a balanced inductively degenerated common source low noise amplifier (LNA) disposed in an RF integrated circuit, said LNA comprising a load impedance comprised of an integrated inductance in parallel with an integrated capacitance, further comprising a first integrated resistance $R_s$ in series with said inductance and a second integrated resistance $R_p$ in parallel with said inductance and capacitance, said first and second integrated resistances having values selected for reducing an amount of resonant load circuit Q over a plurality of instances of the RF integrated circuit.

* * * * *